United States Patent [19]
Krivanek

[11] Patent Number: 5,640,012
[45] Date of Patent: Jun. 17, 1997

[54] PRECISION-CONTROLLED SLIT MECHANISM FOR ELECTRON MICROSCOPE

[75] Inventor: Ondrej L. Krivanek, Lafayette, Calif.

[73] Assignee: Gatan, Inc., Pleasanton, Calif.

[21] Appl. No.: 519,535

[22] Filed: Aug. 25, 1995

[51] Int. Cl.⁶ .................................................. H01J 49/44
[52] U.S. Cl. ........................................ 250/305; 250/311
[58] Field of Search .................................... 250/305, 311, 250/201.1, 205, 229; 354/423; 359/232, 230, 227

[56] References Cited

U.S. PATENT DOCUMENTS

| | | | |
|---|---|---|---|
| 4,017,403 | 4/1977 | Freeman | 250/492.2 |
| 4,789,780 | 12/1988 | Le Poole et al. | 250/305 |
| 4,851,670 | 7/1989 | Krivanek | 250/305 |
| 5,065,029 | 11/1991 | Krivanek | 250/311 |
| 5,282,075 | 1/1994 | Sugimori | 359/227 |
| 5,381,010 | 1/1995 | Gordon | 250/345 |
| 5,400,170 | 3/1995 | Hanada | 359/232 |

FOREIGN PATENT DOCUMENTS

| | | |
|---|---|---|
| 63-127200 | 5/1988 | Japan . |
| 2146790 | 4/1985 | United Kingdom . |
| 2265729 | 10/1993 | United Kingdom . |

OTHER PUBLICATIONS

Pages 177–179 from *Circuits, Devices, and Systems, A First Course in Electrical Engineering, Third Edition*, by Ralph J. Smith, has no date.

*Primary Examiner*—Jack I. Berman
*Assistant Examiner*—Kiet T. Nguyen
*Attorney, Agent, or Firm*—Killworth, Gottman, Hagan & Schaeff, L.L.P.

[57] ABSTRACT

A precision-controlled slit mechanism having an adjustable width which is both accurate and reproducible is provided for apparatuses which are designed to exclude portions of an energy spectrum prior to analysis such as energy-selected imaging filters in electron microscopes. The slit mechanism includes a pair of slit halves, a light source for directing light between the slit halves, a detector for measuring the intensity of light passing from the light source through the slit halves, and an actuator for adjusting the width of the opening between the slit halves in response to the intensity of light measured by the detector.

14 Claims, 3 Drawing Sheets

PRECISION-CONTROLLED SLIT MECHANISM FOR ELECTRON MICROSCOPE

BACKGROUND OF THE INVENTION

The present invention relates to a precision-controlled slit mechanism for use in an apparatus, such as an electron microscope, for analysis of an energy spectrum. More particularly, it relates to an adjustable slit for use in an energy-selected electron imaging filter to select part of an electron energy spectrum.

Modern electron microscopes are capable of imaging individual atoms in a thin sample. However, the images produced by the microscope alone contain no direct information concerning the chemical composition of the sample, and the image quality degrades significantly if the sample is more than a few atomic planes thick. The chemical information can be provided by selectively imaging only with electrons that have, while traversing the sample, experienced energy losses characteristic of particular atomic species. Thus, electrons that have experienced energy losses (other than the selected ones) are filtered out, and the energy spread of the electron beam used to form the image is considerably reduced. The image quality, normally degraded by the chromatic aberration of the imaging lenses, is thereby significantly improved.

The most widely applicable method of energy filtering is to illuminate the sample with a broad electron beam and produce an energy-selected image by an apparatus which forms a focused spectrum of electron energies, selects an energy pass-band, and transforms the spectrum back into an image. Such an apparatus is frequently called an energy-selected electron imaging filter. Attached to a high-performance transmission electron microscope, filters of this type can produce elemental concentration maps containing a large number of image points in a few seconds. They can also substantially improve the resolution of transmission electron images of thicker samples. This is especially important for biological samples which can normally be prepared only down to several hundred to several thousand atomic planes thick.

An example of an energy-selected imaging filter is described in commonly-owned U.S. Pat. No. 4,851,670, the disclosure of which is incorporated by reference. One aspect of such a filter is the need for a slit, through which the electrons pass, and the width of which can be controlled with precision. That is, the slit is used to select a part of an electron energy spectrum which is then transformed into an energy-selected image by later stages of the apparatus. Because the spectrum has a small dispersion, the control requirements for the slit are quite critical, namely that the width of the slit must be adjustable over the range of from less than 1 µm to about 300 µm with a reproducibility in achieving a given slit width of better than 0.5%. The slit must also be able to be completely withdrawn from the path of the electron beam or opened to several millimeters (for non-filtered operation) in width and then put back into the path of the beam and/or closed down to its original width.

Slits used in the prior art have either been of a fixed width or have used manual devices such as screw-type mechanisms for width adjustment. The former have the disadvantage of requiring replacement of one fixed-width slit for another every time a different portion in the energy spectrum is to be analyzed, while the latter have reproducibility problems because of the back lash and dead travel inherent in mechanical screw mechanisms. Further, prior adjustable width slits could not be interfaced with any automatic control apparatus as there was no ability to predict or measure the amount of back lash compensation needed every time the slit width was changed.

Accordingly, the need exists in this art for a precision selecting means defining an energy-loss spectrum interval whose width can be repeatedly and reproducibly set, to be used in an apparatus such as an energy-selected electron imaging filter.

SUMMARY OF THE INVENTION

The need for a precision selecting means is met by the present invention which provides a precision-controlled slit mechanism having an adjustable width which is both accurate and reproducible. The apparatus of the present invention is useful in instruments which are designed to exclude portions of an energy spectrum prior to analysis. It is useful, for example, in an energy-selected imaging filter for an electron microscope. It may also find use in other analytical devices including serial-detection electron spectrometers.

In accordance with one aspect of the present invention, an adjustable slit mechanism is provided and includes a pair of slit halves, a light source for directing light between the slit halves, a detector for measuring the intensity of light passing from the light source through the slit halves, and an actuator for adjusting the width of the opening between the slit halves in response to the intensity of light measured by the detector. Preferably, one of the slit halves is fixed, while the other is movable relative to the fixed slit to control the width of the slit. Alternatively, both halves may be movable relative to one another. The slit halves are preferably electrically isolated from each other.

To provide precision control of the width of the slit opening, the apparatus also includes means for generating a reference signal representative of the intensity of light transmitted through a desired width of a gap between the slit halves and means for comparing the reference signal with the intensity of light measured by the detector. This means may be a programmed general purpose digital computer, or may be, in another embodiment of the invention, simply an electrical circuit capable of providing an analog reference signal.

In the embodiment using movable and fixed slit halves, the actuator which moves the slit half is preferably a piezoelectric actuator which uses a pair of piezoelectrically-controlled springs connected mechanically to the slit half so as to cause it to move toward or away from the fixed slit half. The light source may be, for example, a light-emitting diode and the detector may be a photodiode which detects the intensity of the light from the light emitting diode which reaches it through the opening between the slit halves. To improve the accuracy of the apparatus, the light-emitting diode may optionally be frequency modulated and the signal from the photodiode may optionally be frequency filtered.

In a preferred form, the adjustable slit of the present invention is installed into an energy-selected electron imaging filter for transforming an unfiltered electron image produced by a transmission electron microscope into an energy-selected electron image. The slit is used to select a band pass of electron energies within an electron energy spectrum for analysis, with the slit having the structure described above. In a preferred embodiment, the apparatus also includes a mechanism, such as a pneumatic piston, for moving the slit halves into and out of the path of the electron energy spectrum.

Accordingly, it is a feature of the present invention to provide a precision selecting means having an adjustable width which is both accurate and reproducible. This, and other features and advantages of the present invention, will become apparent from the following detailed description, the accompanying drawings, and the appended claims.

DETAILED DESCRIPTION OF THE PREFERRED EMBODIMENTS

Figure 1:
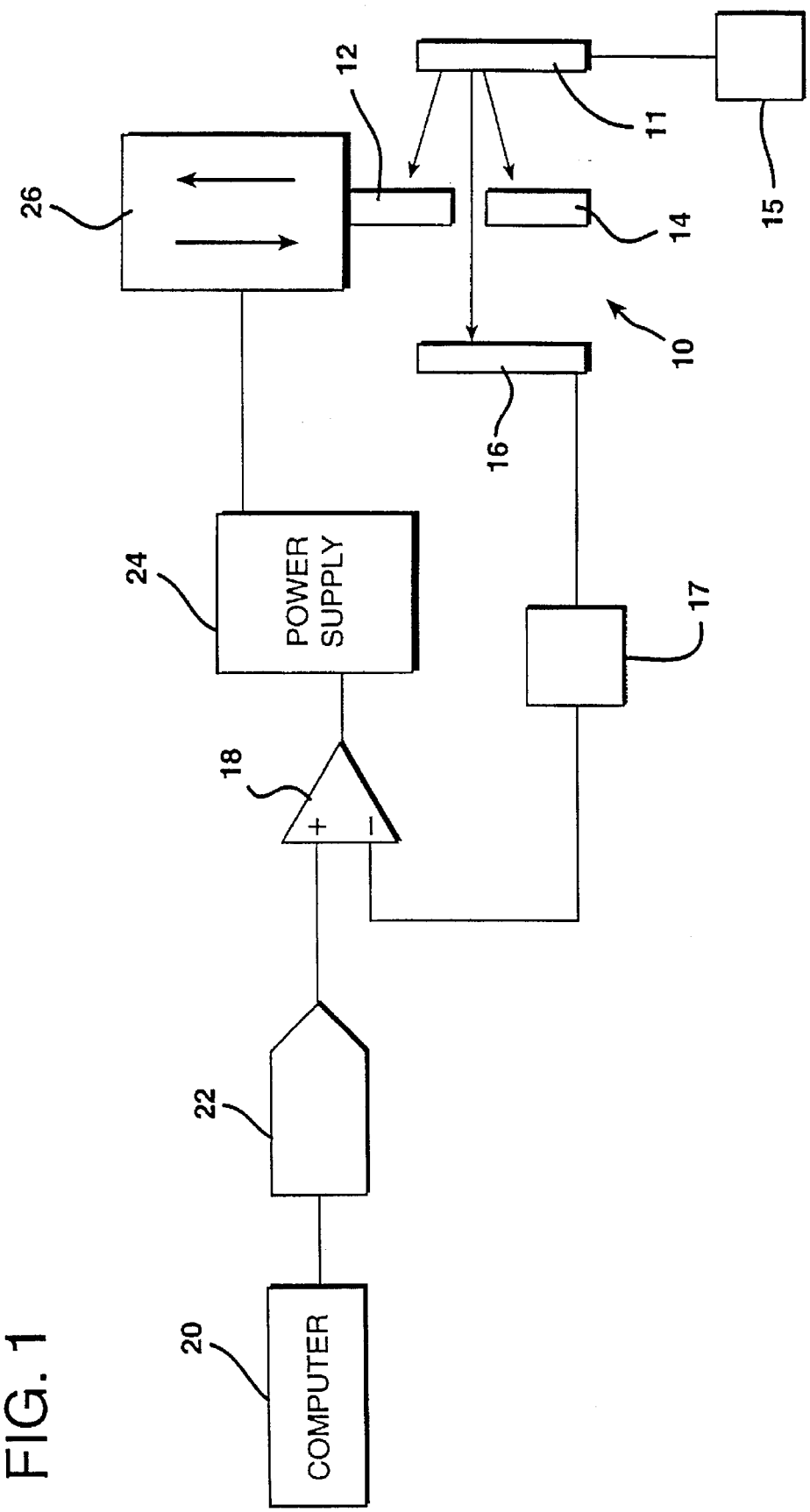
FIG. 1 is a schematic view of the slit mechanism of the present invention comprising a preferred feedback control circuit used to adjust the slit width.

Referring first to FIG. 1, a control circuit for controlling the slit width of the precision selecting slit mechanism 10 of the present invention is illustrated schematically. Light from source 11 passes through the opening between slit halves 12 and 14 and is detected by detector 16. One example of a suitable detector is a photodiode. The signal from detector 16 is then sent to an operational amplifier 18 where it is compared with a reference signal which is indicative of a desired slit width. The reference signal may be generated, for example, by a programmed general purpose computer 20 and converted to analog form by digital to analog converter 22. Using the difference in signal strengths, power is supplied from power supply unit 24 to actuator 26 to move slit half 12 either toward or away from fixed slit half 14. The sign of the signal difference may be used to determine which direction slit half 12 should be moved.

An electrical feedback loop is formed as the signal detected by detector 16 is used to continue to adjust the width of the slit opening until the detector signal matches the predetermined reference signal. This manner of operation completely avoids the problems of prior art screw-operated mechanisms, and also avoids any problems with hysteresis of the piezoelectric actuator or dead travel of the movable slit half 12. A very high degree of reproducibility is obtained, generally to within ±0.5% or better.

Sensitivity may be improved further through rapid frequency modulation of the light source 11 and filtering of the detector signal to enhance the contribution at the modulated frequency. This enhanced sensitivity further increases the precision of the mechanism in adjusting slit width. The two slit halves 12 and 14 are electrically isolated, and connections (not shown) are provided for bringing the electron current collected on them outside of the mechanism for preamplification and further processing. In another embodiment of the invention, computer 20 and digital to analog converter 22 may be eliminated and an analog device substituted to generate the desired analog reference signals.

Figure 2:
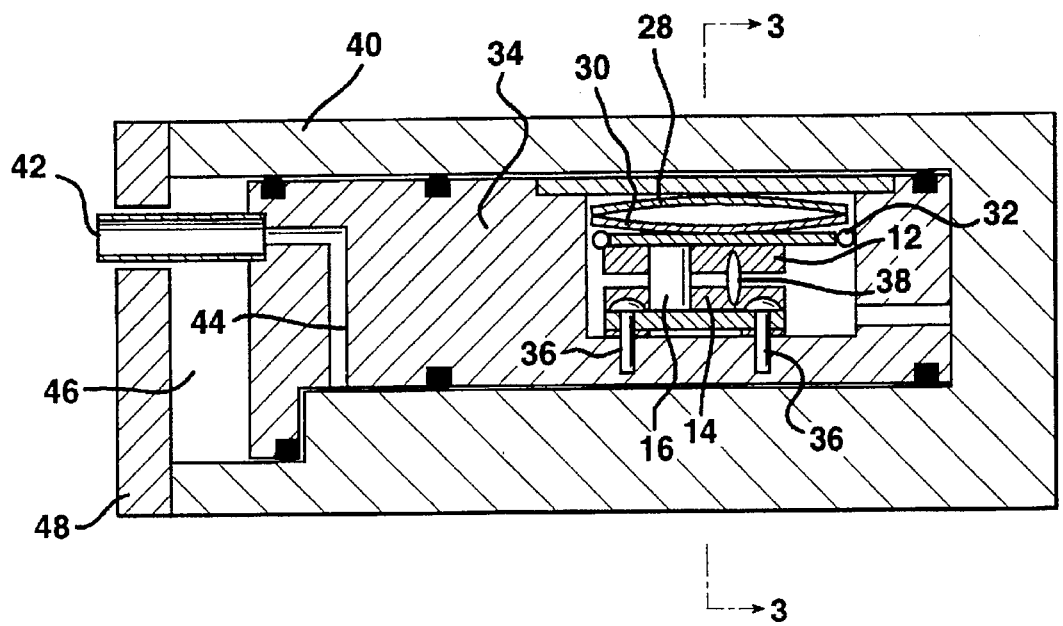
FIG. 2 is a cross-sectional view looking along the path of travel of the electron beam as it traverses the precision-controlled slit mechanism of the present invention.
Figure 3:
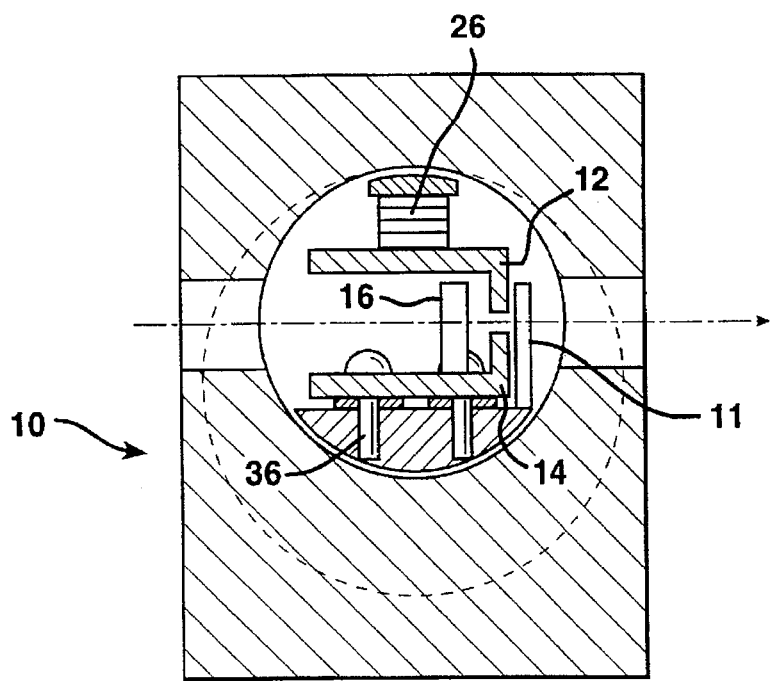
FIG. 3 is a cross-sectional view taken along line 3—3 in FIG. 2.

FIGS. 2 and 3 illustrate in greater detail the construction and operation of slit mechanism 10. As previously described, slit mechanism 10 includes a pair of slit halves 12 and 14. In the embodiment shown, slit half 12 is movable, while slit half 14 is fixed. However, it will be apparent to those skilled in this art that both slit halves could be designed to be movable, or the relative positions of the movable and fixed halves of the slit could be reversed.

Also included is a light source 11 for directing light between respective slit halves 12 and 14. A detector 16 is located on the opposite side of the slit halves from light source 11 for measuring the intensity of the light passing through slit halves 12, 14. In practice, light source 11 may comprise, for example, a light emitting diode whose light is detected by a suitable detector 16 such as, for example, a photodiode. To improve the accuracy of the diode pair, the light-emitting diode may be frequency modulated by frequency modulator 15 and the signal from the photodiode may be filtered by filter 17 as described above.

Slit mechanism 10 also includes an actuator 26 for adjusting the width of the opening between slit halves 12 and 14 responsive to the intensity of the light measured by detector 16. As shown in the preferred embodiment of the invention, actuator 26 comprises a piezoelectric actuator having a pair of piezoelectrically-controlled springs 28 and 30. Applying an electric potential to piezoelectric springs 28 and 30 causes them to flex and move slit half 12 either toward or away from fixed slit half 14. This increases or narrows the slit opening as desired. As shown in FIGS. 2 and 3, movable slit half 12 is mounted on electrically insulated bearings, such as for example, jewel bearings 32, for movement.

In operation, the width of the opening between slit halves 12 and 14 is sensed by emitting light from a source such as light emitting diode 11, passing it through the slit opening, and detecting it with a light detector 16 such as a photodiode on the opposite side of the opening. For small openings (i.e., widths of between about 1 µm to about 300 µm), the signal detected by detector 16 is approximately linearly related to the slit width.

Again referring to FIGS. 2 and 3, fixed slit half 14 is mounted on slit support piston 34 by any suitable means such as, for example, using electrically insulating and non-conducting screws 36. Thus, in the embodiment illustrated, only one of the slit halves moves in relation to the other. As shown schematically, the width of electron beam 38, which is projected in the direction of the arrow in FIG. 3, is greater than the width between slit halves 12 and 14. Thus, by varying the width of the opening between slit halves, a selected portion of electron beam 38 passes through.

The adjustable slit mechanism 10 of the present invention may be moved out of the path of electron beam 38 for operation of the electron microscope in a non-filtered mode. This is accomplished through pneumatic or hydraulic operation of slit support piston 34 within enclosure 40. Application of gas or fluid pressure through inlet 42 and flow passage 44 causes piston 34 to slide (to the left, viewing FIG. 2) into opening 46 and against retaining lid 48. This moves the energy selecting slit out of the path of the electron beam which can pass unobstructed through the mechanism. Releasing the pressure at inlet 42 causes piston 34 to slide the energy selecting slit mechanism 10 back into position in the path of the electron beam.

Figure 4:
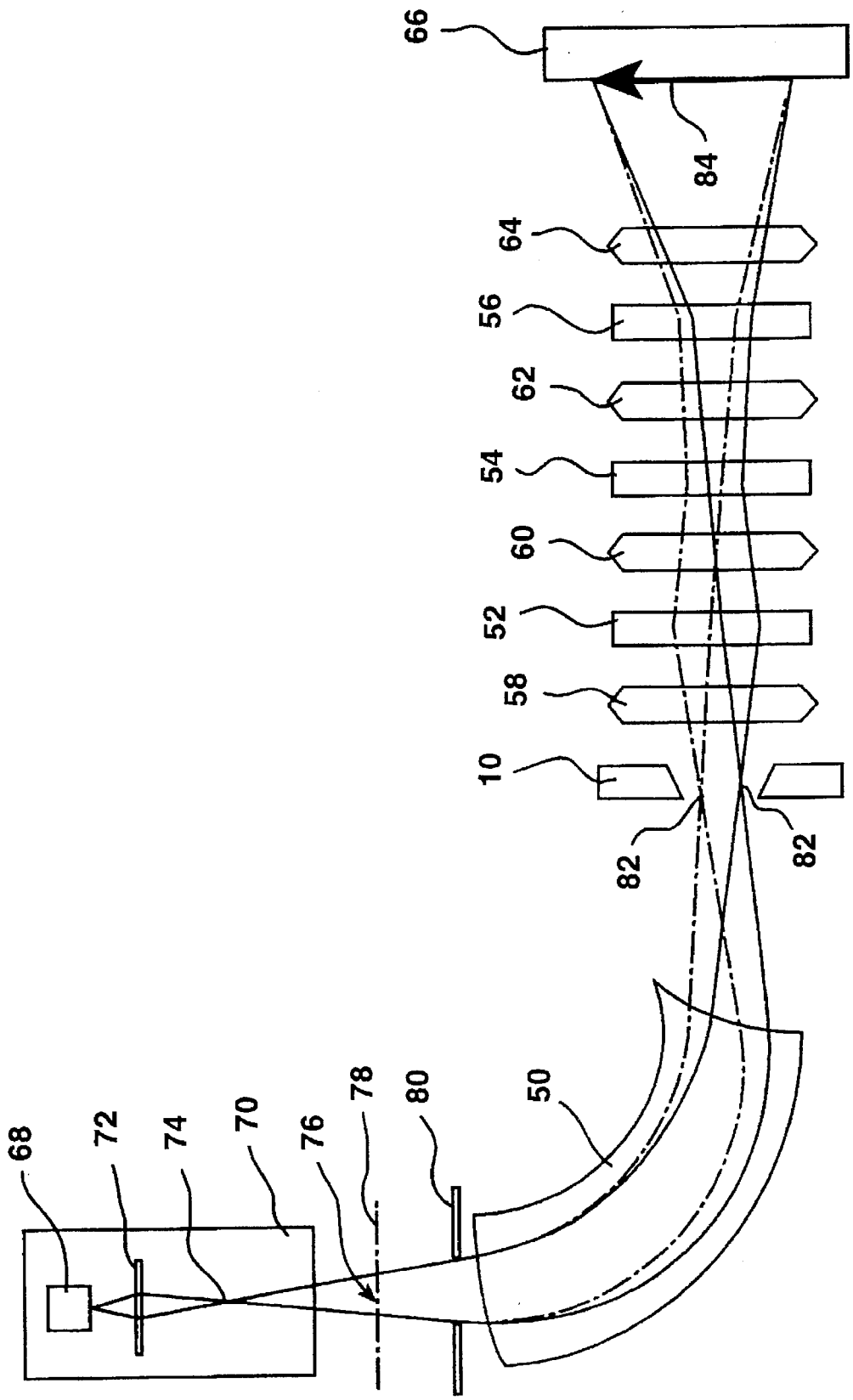
FIG. 4 is schematic view in the dispersion plane of an energy-selected electron imaging filter comprising the slit mechanism of the present invention.

The precision-controlled slit mechanism of the present invention may find use in instruments such as energy-selected electron imaging filters for electron microscopes. As shown on FIG. 4, an energy-selected imaging filter using the slit mechanism of the present invention in an electron microscope is illustrated. The filter comprises an energy-dispersing device 50 which disperses electrons according to their energy, a precision-controlled energy-selecting slit 10 of adjustable width, multiple magnetic quadrupole lenses 52, 54, and 56 and sextupole lenses 58, 60, 62, and 64, and an electron image detector 66. The electrons originate from an electron gun 68 inside an electron microscope column 70. The electrons pass through a thin specimen 72 and are focused into a final cross-over 74, which is typically located in the back focal plane of the final lens of the electron microscope.

The electrons pass through the cross-over and spread out to form an unfiltered electron image 76. The cross-over 74 is typically less than 5 μm in diameter, and this gives a very large depth of focus to the unfiltered image. The image can therefore be observed at various distances below the cross-over, for example on the removable fluorescent screen 78 or at the level of the entrance aperture 80 into the energy-selected imaging filter.

Having passed through aperture 80, the electrons enter the energy-selected imaging filter. Aperture 80 defines which portions of the larger unfiltered image (observable on removable fluorescent screen 78) will be imaged through the filter. Inside the filter, the electrons pass through the energy-dispersing device 50, which produces a focused energy spectrum 82 located at the level of an energy-selecting slit 10 of adjustable width. Slit 10 intercepts electrons of all energies other than those in a narrow pass-band.

The width of the pass-band is defined by the physical width of the opening between slit halves, making control of the width of the opening critical to achieving accurate image information. A preferred energy-dispersing device is a single magnetic sector whose entrance and exit pole faces are at such angles to the electron beam, and are of such curvatures, that its energy resolution remains better than 1 part in 100,000 for an electron beam with a divergence angle of several mrad entering the magnetic sector.

Interposed between energy-selecting slit 10 and image detector 66 are multiple quadrupole lenses 52, 54, and 56 and sextupole lenses 58, 60, 62, and 64. The combined action of these lenses transforms the dispersed electron energy spectrum into a final energy-selected image 84. A preferred electron image detector 66 includes a scintillator fiber-optically coupled to a two-dimensional charge-coupled device. However, any means suitable for the detection of two-dimensional electron images can be used as the image detector 66, including, for example, any type of light camera coupled to an electron scintillator, photographic film directly exposed to the electron beam, a fluorescent screen directly observed by an operator, or a two-dimensional solid-state detector directly exposed to the electron beam.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An adjustable slit mechanism for use in an apparatus for analysis of an energy spectrum comprising:

an energy spectrum passing through said mechanism;

a pair of slit halves;

a light source for directing light between said slit halves;

a first detector for measuring the intensity of light passing from said light source through said slit halves;

a second detector for detecting said energy spectrum passing through said mechanism; and an actuator for adjusting the width of the opening between said slit halves in response to the intensity of light measured by said first detector and for selecting a portion of said energy spectrum which reaches said second detector.

2. An adjustable slit mechanism as claimed in claim 1 in which one of said slit halves is movable relative to the other.

3. An adjustable slit mechanism as claimed in claim 1 further including means for generating a reference signal representative of the intensity of light transmitted through a desired width of a gap between said slit halves and means for comparing said reference signal with the intensity of said light measured by said first detector.

4. An adjustable slit mechanism as claimed in claim 1 in which said actuator is a piezoelectric actuator.

5. An adjustable slit mechanism as claimed in claim 1 in which said light source comprises a light-emitting diode and in which said first detector comprises a photodiode.

6. An adjustable slit mechanism as claimed in claim 5 in which said light-emitting diode is frequency modulated and in which said photodiode provides a signal representative of the intensity of light measured by said photodiode and said signal from said photodiode is frequency filtered.

7. An adjustable slit mechanism as claimed in claim 1 in which said slit halves are electrically isolated from each other.

8. In an energy-selected electron imaging filter for transforming an unfiltered electron image produced by a transmission electron microscope into an energy-selected electron image including an energy-selecting slit mechanism for selecting a band-pass of electron energies within an electron energy spectrum, said slit mechanism comprising:

a pair of slit halves;

a light source for directing light between said slit halves;

a detector for measuring the intensity of said light passing from said light source through said slit halves; and an actuator for adjusting the width of the opening between said slit halves in response to the intensity of said light measured by said detector.

9. An energy-selected electron imaging filter as claimed in claim 8 further including a device for moving said slit halves into and out of the path of said electron energy spectrum.

10. An energy-selected electron imaging filter as claimed in claim 9 in which said device includes a pneumatic piston.

11. An energy-selected electron imaging filter as claimed in claim 8 further including means for generating a reference signal representative of the intensity of light transmitted through a desired width of a gap between said slit halves and means for comparing said reference signal with the intensity of said light measured by said detector.

12. An energy-selected electron imaging filter as claimed in claim 8 in which said actuator is a piezoelectric actuator.

13. An energy-selected electron imaging filter as claimed in claim 8 in which said light source comprises a light-emitting diode and in which said detector comprises a photodiode.

14. An energy-selected electron imaging filter as claimed in claim 13 in which said light-emitting diode is frequency modulated and in which the signal from said photodiode is frequency filtered.

\* \* \* \* \*